United States Patent
Yang et al.

(10) Patent No.: US 12,082,398 B2
(45) Date of Patent: Sep. 3, 2024

(54) CAPACITOR STRUCTURE AND METHOD OF FORMING THEREOF

(71) Applicant: NANYA TECHNOLOGY CORPORATION, New Taipei (TW)

(72) Inventors: Jyun-Hua Yang, Taipei (TW); Kai Hung Lin, Taichung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/457,366

(22) Filed: Aug. 29, 2023

(65) Prior Publication Data

US 2023/0413527 A1   Dec. 21, 2023

Related U.S. Application Data (62) Division of application No. 17/659,845, filed on Apr. 20, 2022, now Pat. No. 11,778,809.

(51) Int. Cl.
*H10B 12/00* (2023.01)
*H01L 49/02* (2006.01)

(52) U.S. Cl.
CPC ........... *H10B 12/315* (2023.02); *H01L 28/40* (2013.01); *H01L 28/60* (2013.01); *H10B 12/033* (2023.02); *H10B 12/34* (2023.02)

(58) Field of Classification Search
CPC ................ H01L 28/40–92; H10B 12/03–0387
See application file for complete search history.

(56) References Cited

U.S. PATENT DOCUMENTS

| | | | |
|---|---|---|---|
| 9,831,303 B2 | 11/2017 | Kuo et al. | |
| 2012/0126300 A1* | 5/2012 | Park | H01G 4/20 |
| | | | 257/296 |
| 2014/0126105 A1 | 5/2014 | Kuo et al. | |
| 2021/0174855 A1* | 6/2021 | Lin | G11C 11/22 |
| 2022/0254795 A1 | 8/2022 | Popovici et al. | |
| 2023/0015379 A1 | 1/2023 | Luo et al. | |

FOREIGN PATENT DOCUMENTS

| CN | 111668372 A | 9/2020 |
|---|---|---|
| EP | 3965142 A1 | 3/2022 |

OTHER PUBLICATIONS

Min Hyuk Park et al., "A comprehensive study on the mechanism of ferroelectric phase formation in hafnia-zirconia nanolaminates and superlattices." Appl. Phys. Rev. 6, 041403(,https://aip.scitation.org/doi/10.1063/1.5118737), Nov. 8, 2019.

\* cited by examiner

*Primary Examiner* — Robert G Bachner
*Assistant Examiner* — Molly K Reida
(74) *Attorney, Agent, or Firm* — CKC & Partners Co., LLC (57) ABSTRACT

A method of forming a capacitor structure includes following operations. A first electrode is formed. A hafnium-zirconium oxide (HZO) layer is formed over the first electrode under a first temperature. An interface dielectric layer is formed over the HZO layer under a second temperature greater than the first temperature. A second electrode is formed over the interface dielectric layer. The HZO layer and the interface dielectric layer are annealed.

4 Claims, 12 Drawing Sheets

CAPACITOR STRUCTURE AND METHOD OF FORMING THEREOF

CROSS-REFERENCE TO RELATED APPLICATION

The present application is a Divisional application of the U.S. application Ser. No. 17/659,845, filed Apr. 20, 2022, which is herein incorporated by reference in its entirety.

BACKGROUND

Field of Invention

The present disclosure relates to capacitor structures and method of forming thereof.

Description of Related Art

In advance memory technology, since sizes of active devices are reduced, capacitors in memory devices should be also scaled. The memory devices are, for example, dynamic random access memory (DRAM). Capacitor dielectric scaled down is getting difficult to meet target. During the capacitors scaling, a lot of effort was put searching for new material stacks to overcome the scaling limitations of the current material stack, such as leakage and sufficient capacitance.

Therefore, how to provide structures with sufficient materials to scaling capacitors and enhance capacitance is one of the subjects to be solved for the industry.

SUMMARY

An aspect of the present disclosure is related to a method of forming a capacitor structure.

According to one embodiment of the present disclosure, a method of forming a capacitor structure includes following operations. A first electrode is formed. A hafnium-zirconium oxide (HZO) layer is formed over the first electrode under a first temperature. An interface dielectric layer is formed over the HZO layer under a second temperature greater than the first temperature. A second electrode is formed over the interface dielectric layer. The HZO layer and the interface dielectric layer are annealed.

In one or more embodiments of the present disclosure, the HZO layer is formed by a thermal atomic layer deposit process, and the first temperature is in a range between 200° C. and 300° C.

In one or more embodiments of the present disclosure, the HZO layer is formed by a plasma atomic layer deposit process, and the first temperature is in a range between 25° C. and 75° C.

In one or more embodiments of the present disclosure, the second temperature is in a range between 300° C. and 350° C.

In one or more embodiments of the present disclosure, forming the HZO layer further includes following operation. A plurality of hafnium oxide layers and a plurality of zirconium oxide layers are formed over the first electrode, wherein a percentage of zirconium oxide layers in the HZO layer is in a range between 5% and 50%.

In some embodiments, the hafnium oxide layers and the zirconium oxide layers are further mixed under the second temperature when the interface dielectric layer is formed under the second temperature.

In one or more embodiments of the present disclosure, a thickness of the HZO layer is in a range between 4 nm and 6 nm.

In one or more embodiments of the present disclosure, a material of the interface dielectric layer is the same as a material of the HZO layer.

In one or more embodiments of the present disclosure, a material of the interface dielectric layer comprises metal oxide material, the metal oxide material comprises aluminum oxide, niobium oxide and/or titanium oxide.

An aspect of the present disclosure is related to a method of forming a capacitor structure.

According to one embodiment of the present disclosure, a method of forming a capacitor structure includes following operations. A first electrode is formed over a substrate, wherein the first electrode includes a first electrode hollow tube. Hafnium-zirconium oxide (HZO) layers are formed over an inner sidewall and an outer sidewall of the first electrode hollow tube under a first temperature. Interface dielectric layers are formed over the HZO layers on the inner sidewall and the outer sidewall of the first electrode hollow tube under a second temperature greater than the first temperature. Second electrodes are formed, wherein the second electrodes includes a second electrode hollow tube surrounding the HZO layers and the interface dielectric layers and a third electrode hollow tube filled in a space formed by one of the interface dielectric layer inside the first electrode hollow tube.

In one or more embodiments of the present disclosure, the method further includes following operation. A strengthen structure is filled in the third electrode hollow tube.

In one or more embodiments of the present disclosure, the HZO layer is formed by a thermal atomic layer deposit process or a plasma atomic layer deposit process, and the first temperature is in a range between 25° C. and 300° C.

In one or more embodiments of the present disclosure, the second temperature is in a range between 300° C. and 350° C.

In one or more embodiments of the present disclosure, forming the HZO layer further includes following operation. A plurality of hafnium oxide layers and a plurality of zirconium oxide layers are formed over the inner sidewall and the outer sidewall of the first electrode hollow tube, wherein a percentage of zirconium oxide layers in the HZO layer is in a range between 5% and 50%.

In one or more embodiments of the present disclosure, materials of the interface dielectric layers comprise metal oxide material, the metal oxide material comprises aluminum oxide, niobium oxide and/or titanium oxide.

An aspect of the present disclosure is related to a capacitor structure.

According to one embodiment of the present disclosure, a capacitor structure includes a first electrode, a hafnium-zirconium oxide (HZO) layer, an interface dielectric layer and a second electrode. The first electrode is formed. The HZO layer is formed over the first electrode. The interface dielectric layer is formed over the HZO layer. The second electrode is formed over the interface dielectric layer. The HZO layer and the interface dielectric layer are located between the first electrode and the second electrode. A first concentration of tetragonal crystal phase of the HZO layer is greater than a second concentration of tetragonal crystal phase of the interface dielectric layer.

In one or more embodiments of the present disclosure, a material of interface dielectric layer is the same as a material of the HZO layer.

In one or more embodiments of the present disclosure, a thickness of the HZO layer is in a range between 4 nm and 6 nm.

An aspect of the present disclosure is related to dynamic random access memory (DRAM) structure.

According to one embodiment of the present disclosure, a DRAM structure includes a substrate, a transistor and the capacitor structure mentioned above. The transistor is formed within the substrate. A conductive pad of the transistor is formed over a top surface of the substrate. The capacitor structure is formed over the substrate and connected to the conductive pad.

In summary, the capacitor structure of the present disclosure can include a dielectric structure with at least two layers used as dielectric layers. Before the HZO layer of the at least two layers is annealed, materials of the HZO layer are mixed when a further interface dielectric layer is formed over the HZO layer, so that a concentration of a tetragonal crystal phase of the HZO layer can be introduced and the dielectric performance of the capacitor structure can be further improved.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

FIGS. 6-10A illustrate cross-section views in different stages of forming a capacitor structure of the present disclosure;

DETAILED DESCRIPTION

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

Since critical dimension of a memory structure should be reduced, active devices and capacitor in the memory structure should be also scaled down. A capacitor is, for example, formed by two electrodes and one or more dielectric layers stacked between the two electrodes. In some embodiments of the present disclosure, the one or more dielectric layers includes hafnium-zirconium oxide (HZO) layer, which is formed by one or more hafnium oxide ($HfO_2$) layers and zirconium oxide ($ZrO_2$) layers.

The dielectric layer of HZO mixture with tetragonal crystal phase can have high-k value so as to increase capacitance of the capacitor with the HZO layer. In some embodiments of the present disclosure, after the hafnium oxide layers and the zirconium oxide layers are stacked together, the hafnium oxide layers and the zirconium oxide layers are further processed to form the HZO mixture with high ratio of tetragonal crystal phase.

Figure 1:
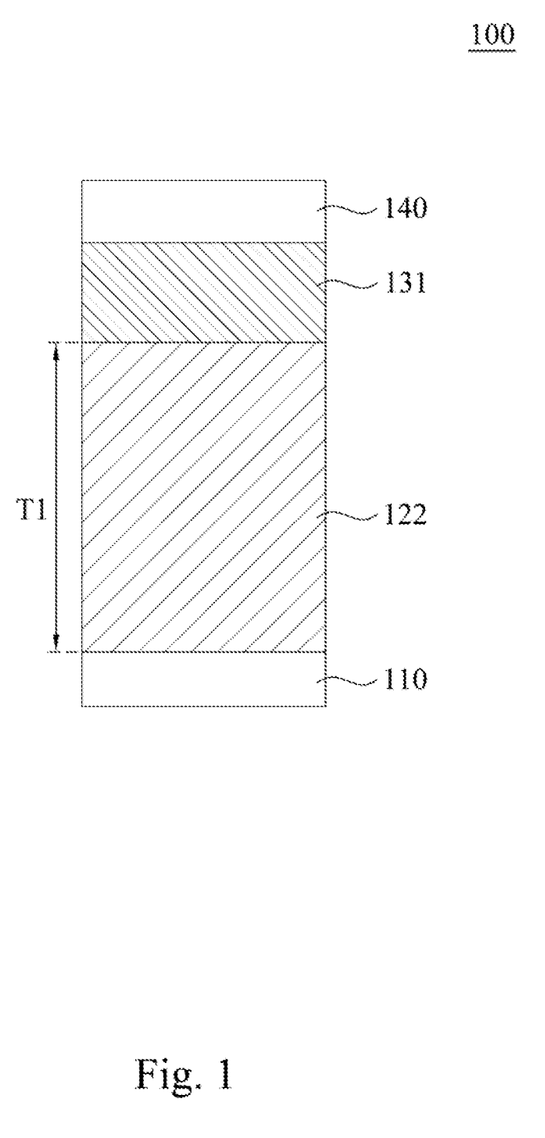
FIG. 1 illustrates a capacitor structure according to one embodiment of the present disclosure.

Reference is made by FIG. 1. FIG. 1 illustrates a capacitor structure 100 according to one embodiment of the present disclosure.

As shown in FIG. 1, in this embodiment, the capacitor structure 100 includes a first electrode 110, a hafnium-zirconium oxide (HZO) layer 122, an interface dielectric layer 131 and a second electrode 140.

The first electrode 110 can be regarded as a bottom cell plate. The second electrode 140 can be regarded as a top cell plate. In some embodiments, the first electrode 110 and the second electrode 140 are conductive structure formed by conductive material. For example, the conductive material of the first electrode 110 and the second electrode 140 includes metal. In some embodiments, the conductive material of the first electrode 110 and the second electrode 140 is titanium nitride (TiN). It should be noted that the above conductive material of the first electrode 110 and the second electrode 140 is an example and does not intend to limit the present disclosure.

In FIG. 1, the HZO layer 122 and the interface dielectric layer 131 is formed between the first electrode 110 and the second electrode 140. The HZO layer 122 is formed over the first electrode 110. The interface dielectric layer 131 is formed over the HZO layer 122. The interface dielectric layer 131 is covered by the second electrode 140, so that the interface dielectric layer 131 is located between the HZO layer 122 and the second electrode 140.

In this embodiment, as mentioned above, the HZO layer 122 is formed by layer stacks of the hafnium oxide layers and the zirconium oxide layers. In the formed capacitor structure 100 shown in FIG. 1, the hafnium oxide layers and the zirconium oxide layers in the HZO layer 122 have been further mixed such that the HZO layer 122 has a great concentration of tetragonal crystal phase.

In some embodiments, a percentage of the zirconium oxide layers in the HZO layer 122 is equal to or less than a percentage of the hafnium oxide layers in the HZO layer 122. In some embodiments, the percentage of the zirconium oxide layers in the HZO layer 122 is in a range between 5% and 50%. That is, the percentage of the hafnium oxide layers in the HZO layer 122 is in a range between 50% and 95%. Most of the HZO layer 122 can be formed by the hafnium oxide layers.

In this embodiment, the HZO layer 122 is formed by an atomic layer deposit (ALD) process and an annealing process. For details, please refer to following discussion.

In this embodiment, the HZO layer 122 has a thickness T1 along a direction in which the first electrode 110, the HZO layer 122, the interface dielectric layer 131 and the second electrode 140 are arranged along. In some embodiment, the thickness T1 is in a range between 4 nm and 6 nm.

As mentioned above, the HZO layer 122 can be deposited on the first electrode 110 by the ALD process. The ALD process can include a lot of cycles, and a single atomic layer (film) of one of the hafnium oxide layers and the zirconium oxide layers can be deposited over the first electrode 110 by one cycle of the ALD process. In this embodiment, the ALD process can includes at least cycles, so that the thickness T1 is in a determined range, e.g. between 4 nm and 6 nm.

In some embodiments, based on the composition of the hafnium oxide layers and the zirconium oxide layers in the HZO layer 122, numbers of cycles related to hafnium oxide layers and numbers of cycles related to zirconium oxide layers can be adjusted.

The interface dielectric layer 131 is formed over the HZO layer 122. In this embodiment, the interface dielectric layer 131 is formed after the HZO layer 122 is formed.

In some embodiments, material of the interface dielectric layer 131 is metal oxide. For example, in some embodiments, the metal oxide material of the interface dielectric layer 131 includes aluminum oxide, niobium oxide and/or titanium oxide.

In one embodiment of the present disclosure, the material of the interface dielectric layer 131 is the same as the material of the HZO layer 122. That is, the interface dielectric layer 131 can be formed by hafnium oxide layers and zirconium oxide layers.

In some embodiments, a composition of the hafnium oxide layers and the zirconium oxide layers of the interface dielectric layer 131 is different from a composition of the hafnium oxide layers and the zirconium oxide layers of the HZO layer 122. For example, in some embodiments, a percentage of the zirconium oxide layers in the HZO layer 122 is less than a percentage of the zirconium oxide layers in the interface dielectric layer 131. In a specific embodiment, the percentage of the zirconium oxide layers in the HZO layer 122 is in a range between 5% and 50%, and the percentage of the zirconium oxide layers in the interface dielectric layer 131 can be greater than 50%.

In some embodiments, the interface dielectric layer 131 has a thickness less than the thickness T1 of the HZO layer 122. For example, in some embodiments, the HZO layer 122 has a thickness T1 in a range between 4 nm and 6 nm, and the thickness of the interface dielectric layer 131 is few angstroms. In some embodiments, the thickness of the interface dielectric layer 131 is greater than the thickness T1 of the HZO layer 122.

In some embodiments, the composition of the hafnium oxide layers and the zirconium oxide layers of the interface dielectric layer 131 is the same as the composition of the hafnium oxide layers and the zirconium oxide layers of the HZO layer 122. However, a concentration of tetragonal crystal phase of the interface dielectric layer 131 is different from the concentration of tetragonal crystal phase of the HZO layer 122.

In this embodiment, after the HZO layer 122 is formed under a first temperature, the interface dielectric layer 131 is formed over the HZO layer 122 under a second temperature. The second temperature is greater than the first temperature. That is, during the interface dielectric layer 131 is formed under the second temperature, the hafnium oxide layers and the zirconium oxide layers of the HZO layer 122 are further mixed.

After a following annealing process is performed, the mixed hafnium oxide layers and the zirconium oxide layers of the HZO layer 122 would induce a great concentration of tetragonal crystal phase of the HZO layer 122. The HZO layer 122 with great concentration of tetragonal crystal phase has high-k value, so that the capacitance of the capacitor structure 100 is increased.

In some embodiments, the capacitor structure 100 can be formed on a substrate. For example, the capacitor structure 100 can be formed on a semiconductor substrate with an exposed conductive or a connector of a transistor, so that the capacitor structure 100 and the transistor forms a one-transistor-one-capacitor (1T1C) memory cell of a DRAM structure.

The transistor in the substrate can have a small size. Since the dielectric structure, which includes the HZO layer 122 and the interface dielectric layer 131, of the capacitor structure 100 can be formed by adjusting temperature, the capacitor structure 100 can have a sufficient size for a small transistor and a suitable capacitance for operations of the overall 1T1C memory cell.

Reference is made by FIGS. 2-5. FIGS. 2-5 illustrate cross-section views in different stages of forming a capacitor structure 100 of the present disclosure. In some embodiments, FIGS. 2-5 illustrate different stages of forming the capacitor structure 100 of FIG. 1.

Figure 2:
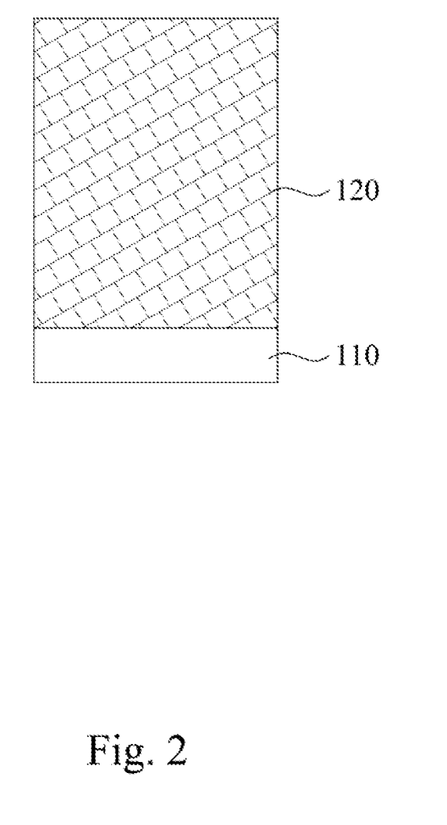
FIGS. 2-5 illustrate cross-section views in different stages of forming a capacitor structure of the present disclosure.

In FIG. 2, a first electrode 110 is provided. In some embodiments, the first electrode 110 can be disposed on an exposed conductive pad of a transistor formed within a semiconductor substrate.

As shown in FIG. 2, a hafnium-zirconium oxide (HZO) layer 120 is formed over the first electrode 110 under a first temperature.

In this embodiment, the HZO layer 120 includes a plurality of hafnium oxide layers and zirconium oxide layers. The hafnium oxide layers and the zirconium oxide layers are stacked together to form the HZO layer 120.

Each of the hafnium oxide layers and the zirconium oxide layers in the HZO layer 120 is a single atomic layer, which is deposited by an ALD process in this embodiment. As mentioned above, the ALD process includes a plurality of cycles, and one single atomic layer of the hafnium oxide layers and the zirconium oxide layers is deposited by one cycle of the ALD process.

For example, in some embodiments of the HZO layer 120, a first number of cycles related to the hafnium oxide layers is performed to form a first layer stack with a first number of the hafnium oxide layers, then a second number of cycles related to the zirconium oxide layers is performed to form a second layer stack with the second number of the zirconium oxide layers over the first layer stack of the hafnium oxide layers.

In some embodiments of the HZO layer 120, a third number of cycles related to the zirconium oxide layers is performed to form a third layer stack with a third number of the zirconium oxide layers, then a fourth number of cycles related to the hafnium oxide layers is performed to form a fourth layer stack with the fourth number of hafnium oxide layers over the third layer stack of the zirconium oxide layers.

In some embodiments of the HZO layer 120, the HZO layer 120 can be a sandwich stacks. For example, a fifth number of cycles related to the hafnium oxide layers is performed to form a firth layer stack with a fifth number of the hafnium oxide layers, a sixth number of cycles related to the zirconium oxide layers is performed to form a sixth layer stack with the sixth number of the zirconium oxide layers over the fifth layer stack of the hafnium oxide layers, and then a seventh number of cycles related to the hafnium oxide layers is performed to form a seventh layer stack with a seventh number of the hafnium oxide layers over the sixth layer stack. In such case, the sixth layer stack of the zirconium oxide layers is sandwiched by the fifth and seventh layer stack of the hafnium oxide.

By controlling the total numbers of cycle of the ALD process, a thickness of the HZO layer 120 is determined. The hafnium oxide layers and the zirconium oxide layers in the HZO layer 120 are further mixed in the following operations.

In some embodiments, the ALD process includes a plasma ALD or a thermal ALD.

In some embodiments, the HZO layer 120 is formed by the thermal ALD, and the thermal ALD is performed under the first temperature in a range between 200° C. and 300° C.

In some embodiments, the HZO layer 120 is formed by the plasma ALD, and the plasma ALD is performed under the first temperature in a range between 25° C. and 75° C.

Figure 3:
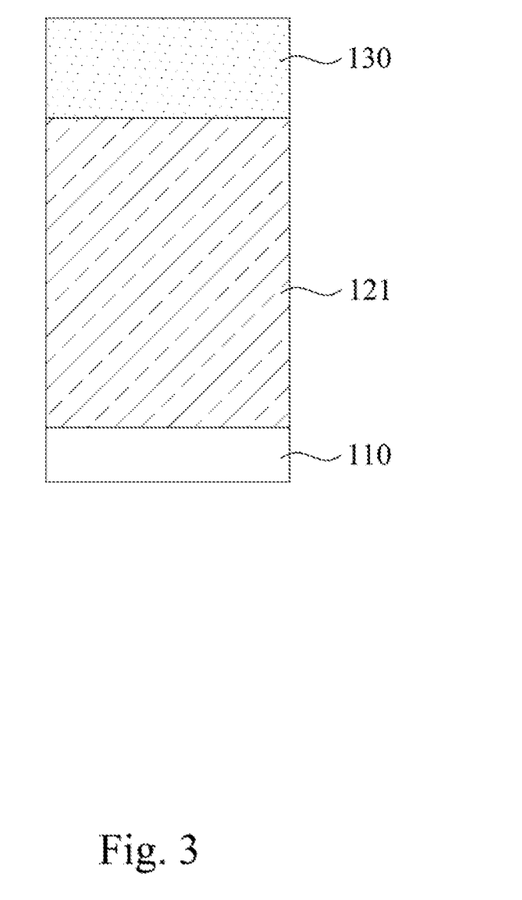

Continued with FIG. 2, in FIG. 3, and an interface dielectric layer 130 is formed over the HZO layer 120 under a second temperature greater than the first temperature in which the HZO layer 120 is formed under, and the hafnium oxide layers and the zirconium oxide layers in the HZO layer 120 is further mixed under the second temperature to form the HZO layer 121, which is beyond layer stack of the hafnium oxide layers and zirconium oxide layers and to be initially crystalized.

As mentioned above, in some embodiments, material of the interface dielectric layer 130 is metal oxide. For example, in some embodiments, the metal oxide material of the interface dielectric layer 130 includes aluminum oxide, niobium oxide and/or titanium oxide. In some embodiments, the material of the interface dielectric layer 130 is the same as the material of the HZO layer 120. That is, the interface dielectric layer 130 can be formed by hafnium oxide layers and zirconium oxide layers.

Since the second temperature is greater than the first temperature, forming the interface dielectric layer 130 can be regarded as a thermal treatment process to treat the HZO layer 120, so that the HZO layer 121 with mixed hafnium oxide and zirconium oxide.

In some embodiments, the interface dielectric layer 130 is formed under the second temperature in a range between 300° C. and 350° C. The second temperature is greater than the first temperature in which a plasma ALD or a thermal ALD is performed under.

In some embodiments, the thickness of the interface dielectric layer 130 is less than the thickness of the HZO layer 121. In some embodiments, the thickness of the interface dielectric layer 130 is greater than the thickness of the HZO layer 121.

Figure 4:
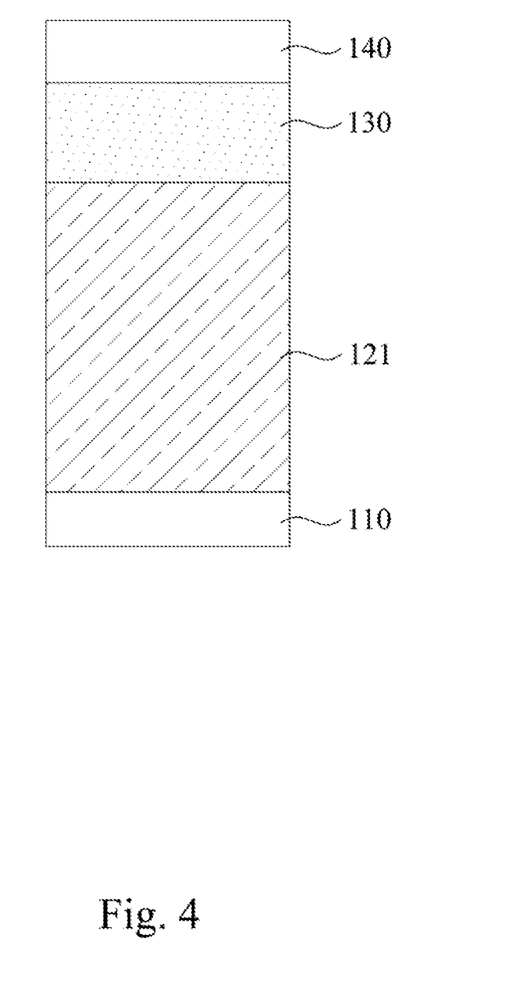

In FIG. 4, a second electrode 140 is formed over the interface dielectric layer 130. The first electrode 110 and the second electrode 140 are conductive materials. In some embodiments, the conductive material of the first electrode 110 and the second electrode 140 is titanium nitride (TiN).

Figure 5:
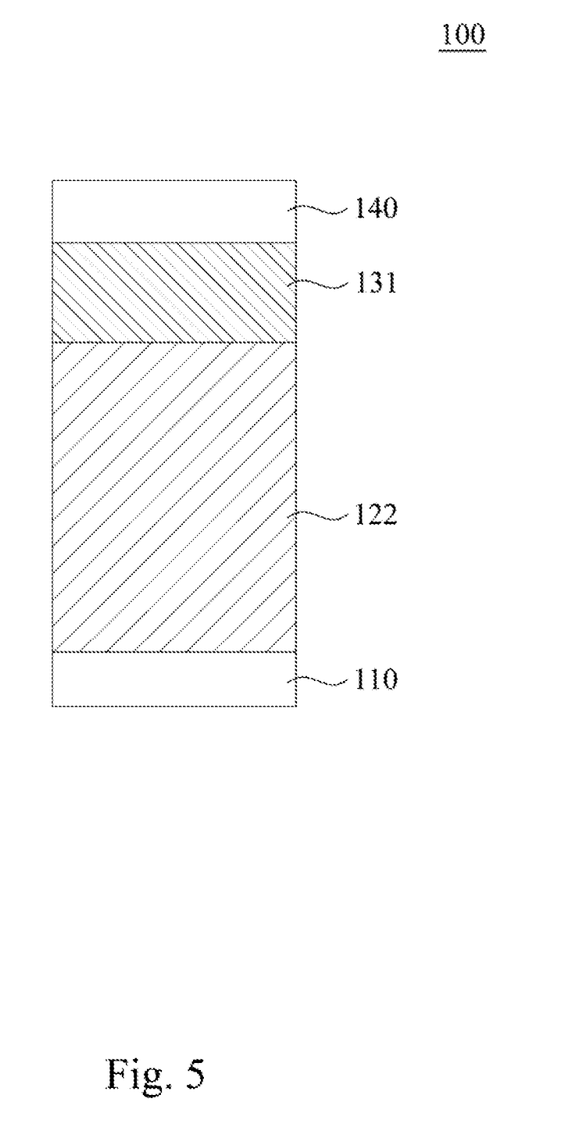

Continued with FIG. 4, in FIG. 5, an annealing process is performed, and the HZO layer 121 and the interface dielectric layer 130 are annealed, and the capacitor structure 100 is formed (see FIG. 1).

After the annealing processing is performed, the HZO layer 121 and the interface dielectric layer 130 are annealed to be crystalized.

In FIG. 5, the HZO layer 122 is formed by annealing the HZO layer 121, and the interface dielectric layer 131 is formed by annealing the interface dielectric layer 130. The HZO layer 122 with great concentration of tetragonal crystal phase is formed by the HZO layer 121 with the mixed hafnium oxide layers and the zirconium oxide layers.

In details, the HZO layer 122 formed by annealing the HZO layer 121 includes orthorhombic crystal phase (o-phase), tetragonal crystal phase (t-phase) and cubic crystal phase (c-phase). However, since the hafnium oxide layers and the zirconium oxide layers in the HZO layer 121 has been mixed during the interface dielectric layer 130 is formed under the high second temperature, most of the HZO layer 122 has the tetragonal crystal phase, and the HZO layer 122 with tetragonal crystal phase has high-k value. The HZO layer 122 and the interface dielectric layer 131 can be regarded as a dielectric structure of the capacitor structure 100. The high-k value of the overall dielectric structure can induce great capacitance for the capacitor structure 100.

In some embodiments, concentration of the tetragonal crystal phase of the HZO layer 122 and the interface dielectric layer 131 can be defined by optical measuring tool, e.g., an X-ray photoelectron spectroscopy (XPS).

Please focus on concentrations of the crystal phase in the HZO layer 122. The formed HZO layer 122 can includes orthorhombic crystal phase, tetragonal crystal phase and cubic crystal phase, and the portions with different crystal phase of the HZO layer 122 would induce different diffraction result.

By inducing a X-ray diffraction for the formed HZO layer 122 and measuring a corresponding intensity spectrum, ratio of the areas related to orthorhombic crystal phase, tetragonal crystal phase and cubic crystal phase in the HZO layer 122 can be determined.

In some embodiments, such measurement can be achieved by a x-ray diffractometer (XRD). In some embodiments, the x-ray diffraction used for determining the ratio of the orthorhombic crystal phase, tetragonal crystal phase and cubic crystal phase can be GIXRD-grazing-angle incidence x-ray diffraction.

In some embodiment, the areas of the orthorhombic crystal phase, tetragonal crystal phase and cubic crystal phase in the HZO layer 122 can be checked by an optical photo, e.g., an optical pattern measured by high resolution transmission electron microscope (TEM).

In some embodiment, a concentration of tetragonal crystal phase of the HZO layer 122 can be defined by how much area of tetragonal crystal phase is occupied in the areas of the HZO layer 122. Similarly, the concentration of tetragonal crystal phase of the interface dielectric layer 131 can be defined.

In some embodiments, annealing process can be performed under a third temperature in a range between 400° C. and 600° C.

Since the HZO layer 122 is formed by a two-step thermal process, which includes a mixing of the hafnium oxide layers and the zirconium oxide layers during the interface dielectric layer 130 is formed and an annealing process, the concentration of tetragonal crystal phase of the HZO layer 122 is greater than a concentration of tetragonal crystal phase of the interface dielectric layer 131.

Referring to FIG. 1 and FIG. 5, in this embodiment, the HZO layer 125 can have a determined thickness T1 to ensure total capacitance of the capacitor structure.

Reference is made by FIGS. 6-10A. FIGS. 6-10A illustrate cross-section views in different stages of forming a capacitor structure 200 of the present disclosure.

Figure 6:
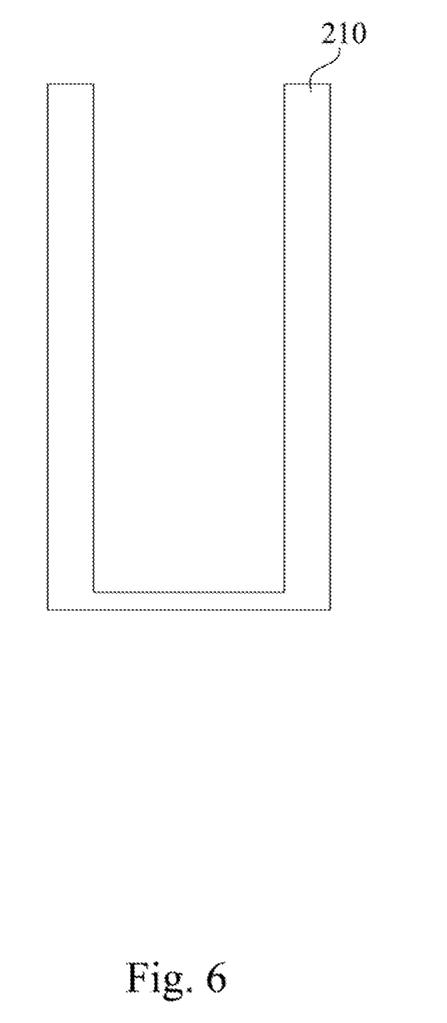

FIG. 6 illustrates a schematic cross-section view. As shown in FIG. 6, a first electrode 210 is provided. In this embodiment, the first electrode 210 is a conductive hollow tube, which can be regarded as a electrode hollow tube. In some embodiments, the first electrode is a TiN tube.

Figure 7:
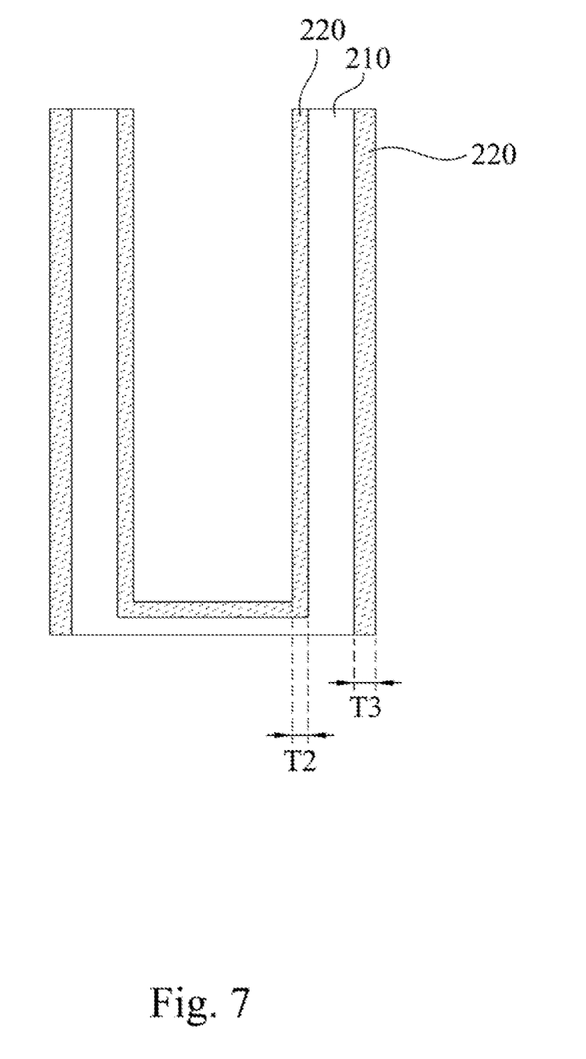

Continued with FIG. 6, in FIG. 7, hafnium-zirconium oxide (HZO) layers 220 are formed under a first temperature. In this embodiment, two HZO layers 220 are respectively formed over an inner sidewall and an outer sidewall of the conductive hollow tube of the first electrode 210.

In this embodiment, the two HZO layers 220 are similar to the HZO layer 120 shown in FIG. 2.

Each HZO layers 220 is formed by hafnium oxide layers and zirconium oxide layers.

In this embodiment, the hafnium oxide layers and the zirconium oxide layers of the HZO layers 220 are deposited over the inner sidewall and the outer sidewall of the first electrode 210 by an ALD process. In some embodiments, the HZO layer 220 can be formed by a plasma ALD under the first temperature in a range between 25° C. and 75° C. In some embodiments, the HZO layer 220 can be formed by a thermal ALD under the first temperature in a range between 200° C. and 300° C.

As shown in FIG. 7, the HZO layer 220 formed over the inner sidewall of the first electrode 210 has a thickness T2, and the HZO layer 220 formed over the outer sidewall of the first electrode 210 has a thickness T3. Each of the thickness T2 and the thickness T3 is greater than a determined length to ensure capacitance of the formed capacitor 200. In some embodiments, the each of the thickness T2 and the thickness T3 is in a range between 4 nm and 6 nm. In some embodiments, the thickness T2 is the same as the thickness T3 since the two HZO layers 220 are formed by the same ALD process. In some embodiment, the thickness T2 can be different from the thickness T3.

As mentioned above, the ALD process can includes cycles, and each cycle of the ALD process is used to deposit a single atomic layer (film). Therefore, the thickness T2 and the thickness T3 can be determined by adjust number of cycles of the ALD process.

Figure 8:
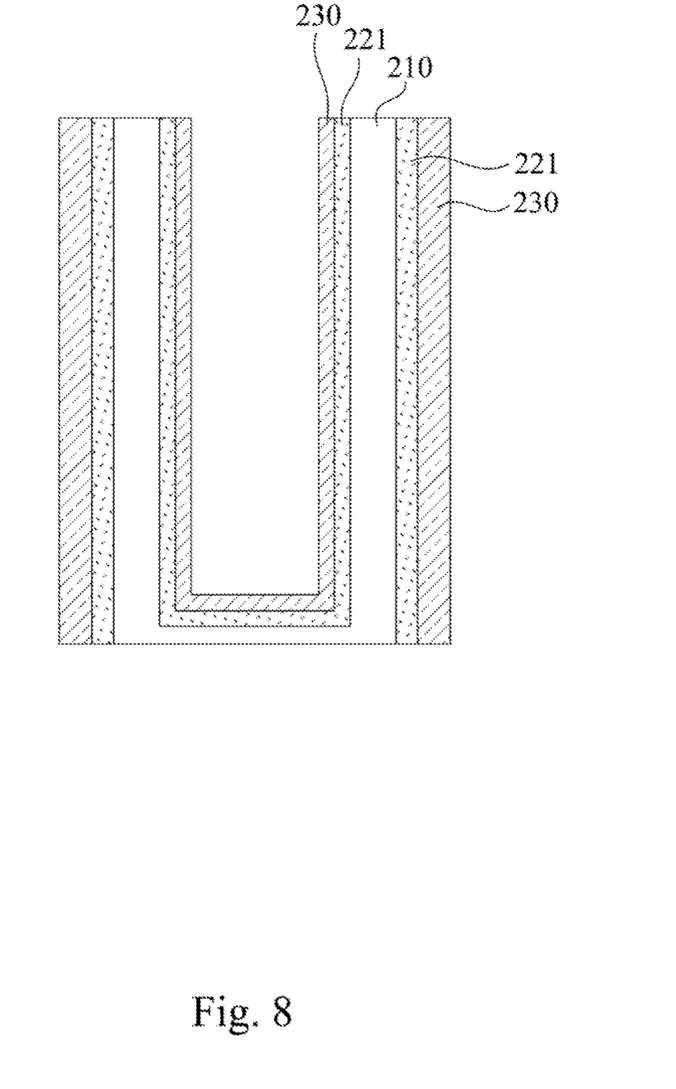

In FIG. 8, the interface dielectric layers 230 are formed over the HZO layers 220 on the inner sidewall and the outer sidewall of the first electrode 110 under a second temperature greater than the first temperature.

Similar to the stage shown in FIG. 3, in FIG. 8, the hafnium oxide layers and the zirconium oxide layers in the HZO layer 220 are further mixed together to form the HZO layers 221 beyond layer stack during the interface dielectric layer 230 is formed under the second temperature greater than the first temperature in which the HZO layer 220 is formed under.

In some embodiments, the second temperature is in a range between 300° C. and 350° C. The second temperature is greater than the processing temperature of the plasma ALD or the thermal ALD.

In some embodiments, material of the interface dielectric layer 230 is metal oxide. For example, in some embodiments, the metal oxide material of the interface dielectric layer 230 includes aluminum oxide, niobium oxide and/or titanium oxide.

In some embodiments, the material of the interface dielectric layer 230 is the same as the material of the HZO layer 220. That is, the interface dielectric layer 230 can be formed by hafnium oxide layers and zirconium oxide layers. However, the hafnium oxide layers and zirconium oxide layers of the HZO layer 221 is mixed after the interface dielectric layer 230 is formed, and it affects the concentration of tetragonal crystal phase after following annealing process.

Figure 9:
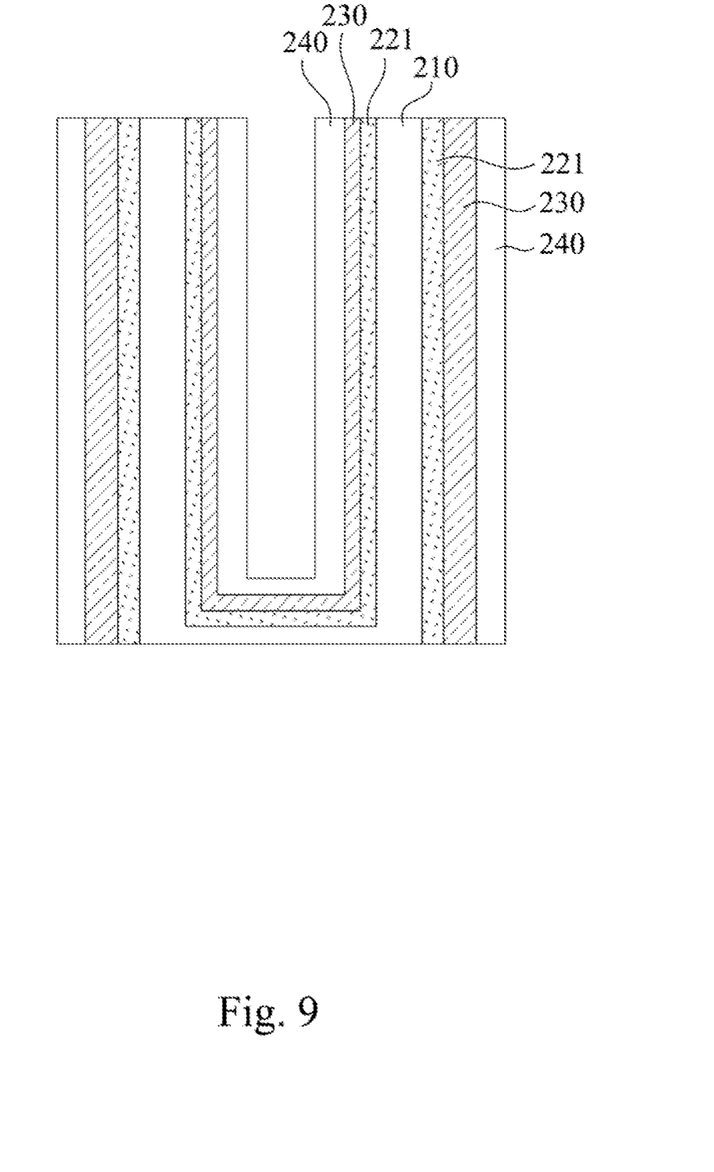

Continued with FIG. 8, in FIG. 9, two second electrodes 240 are formed. One of the second electrode 240 is a conductive hollow tuber, which can also be regarded as an electrode hollow tube, surrounded the HZO layer 221 and the interface dielectric layer 230. Another one of the second electrode 240 is a hollow tube filled in a space formed by the interface dielectric layer 230 inside the first electrode 210.

Figure 10A:
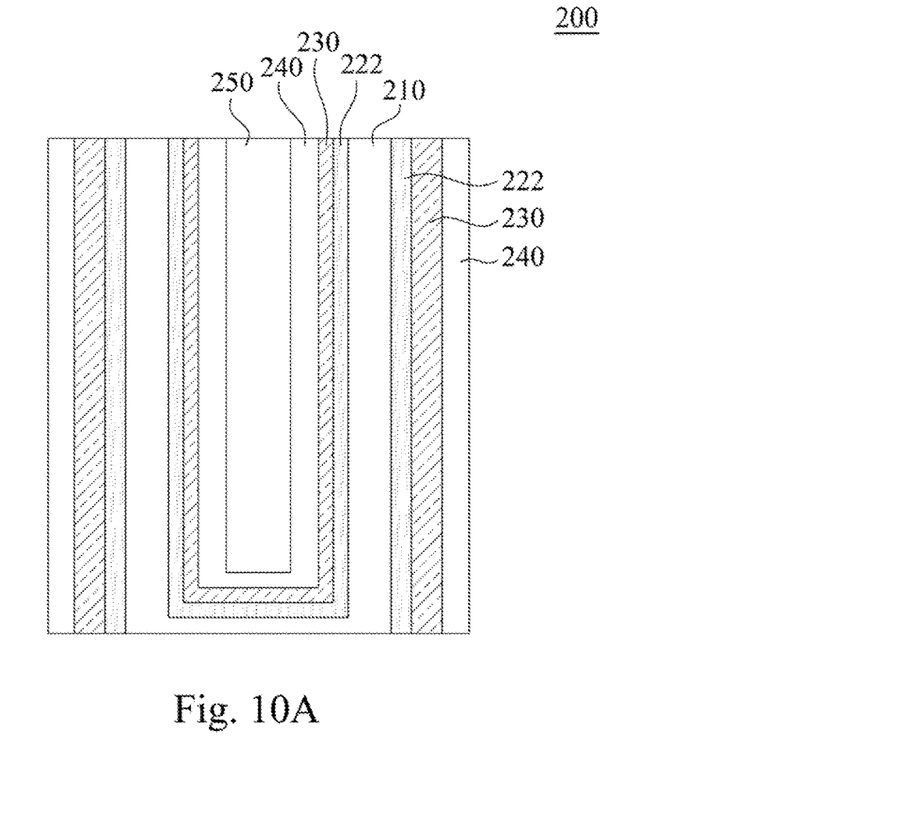
Figure 10B:
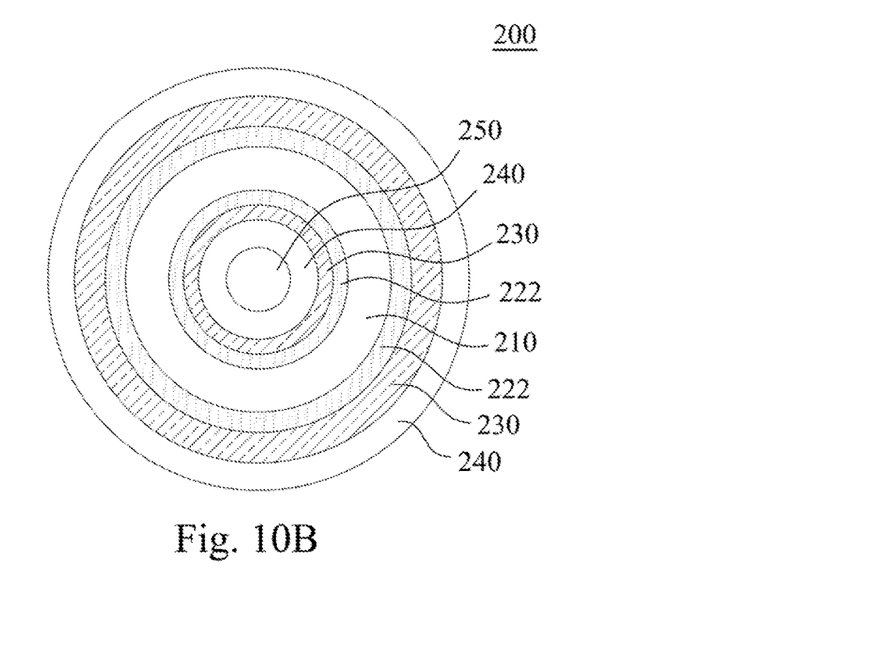
FIG. 10B illustrate a schematic top view of the capacitor structure of FIG. 10A.

Reference is made by FIGS. 10A and 10B. FIG. 10B illustrates a schematic top view of the capacitor structure of FIG. 10A. In FIGS. 10A and 10B, a strengthen structure 250 is formed in the second electrode 240 inside the first electrode 210, and the overall structure in FIG. 10 is annealed to form a capacitor structure 200. A HZO layer 222 is formed by annealing the HZO layer 221. An interface dielectric layer 231 is formed by annealing the interface dielectric layer 230. The strengthen structure 250 is used to enhance total structure strength of the capacitor structure 200. In some embodiments, material of the strengthen structure 250 includes germanium (Ge).

Similar to the HZO layer 122 and the interface dielectric layer 131, the HZO layer 222 and the interface dielectric layer 231 are crystalized, the HZO layer 222 have a great concentration of tetragonal crystal phase, and the HZO layer 222 is with high k value.

In some embodiments, annealing process can be performed under a third temperature in a range between 375° C. and 600° C.

In this embodiment, the capacitor structure 200 includes two capacitors. One of the capacitors is formed by the first electrode 210, the second electrode 240 inside the first electrode and the HZO layer 222 and the interface dielectric layer 231 located between the first electrode 210 and the second electrode 240 inside the first electrode 210. Another one of the capacitors is formed by the first electrode 210, the second electrode 240 out of the first electrode and the HZO layer 222 and the interface dielectric layer 231 located between the first electrode 210 and the second electrode 240 being outside the first electrode 210 and surrounding the first electrode, the HZO layer 222 and the interface dielectric layer 231.

Figure 11:
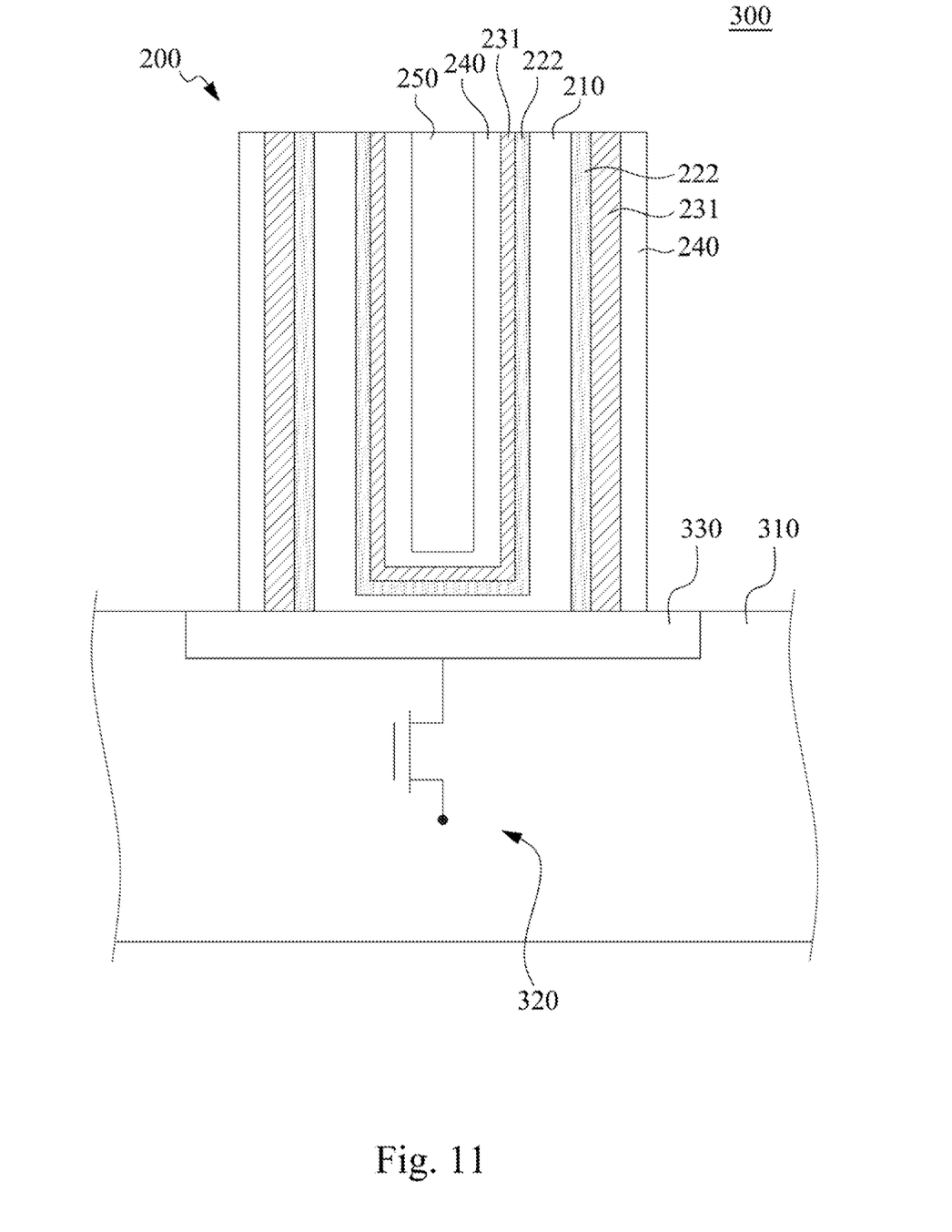
FIG. 11 illustrates a schematic view of a DRAM structure according to one embodiment of the present disclosure.

Reference is made by FIG. 11. FIG. 11 illustrates a schematic view of a DRAM structure 300 according to one embodiment of the present disclosure.

As shown in FIG. 11, the capacitor 200 is formed over a substrate 310. In some embodiments, the substrate 310 is a semiconductor substrate, and a transistor 320 is formed within the substrate 310. A conductive pad 330 connected to the transistor 320 is exposed from a top surface of the substrate 310, and the capacitor 200 is disposed over the conductive pad 330.

Therefore, the capacitor 200 and the transistor 320 form a 1T1C memory cell of the DRAM structure 300.

It should be noted that the transistor 320 in the substrate 310 can have a small size. Since the dielectric structure, which includes the HZO layer 222 and the interface dielectric layer 231, of the capacitor structure 200 can be formed by adjusting temperature, the capacitor structure 200 can have a sufficient size for a small transistor 320 and a suitable capacitance for operations of the overall 1T1C memory cell in the dynamic random access memory (DRAM) structure 300.

Figure 12:
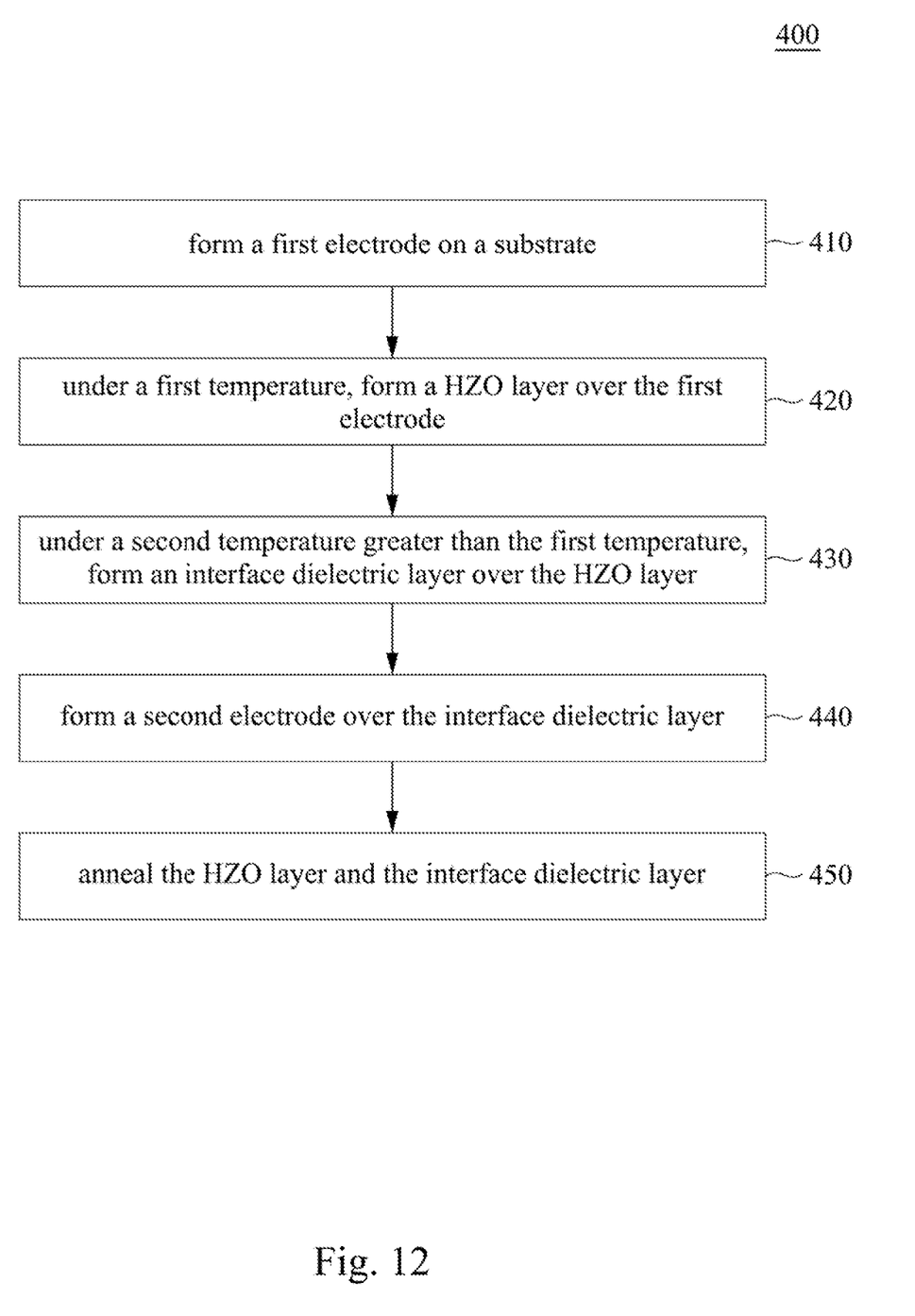
FIG. 12 illustrates a schematic flow chart of a method of forming a capacitor structure according to one embodiment of the present disclosure.

FIG. 12 illustrates a schematic flow chart of a method of forming a capacitor structure according to one embodiment of the present disclosure. The method 400 includes operations 410-450, which summarized an example method of forming a capacitor structure of the present disclosure.

In one embodiment of the present disclosure, please refer to FIGS. 2-5 and FIG. 12.

Referring to FIG. 2, in operation 410, a first electrode 110 is formed. Also referring to FIG. 11, the first electrode 110 can be formed on a substrate.

Referring to FIG. 2, in operation 420, a HZO layer 120 is formed over the first electrode 110 under a first temperature. The HZO layer 120 is a layer stack of hafnium oxide layers and zirconium oxide layers. In this embodiment, the HZO layer 120 is formed by an ALD process.

Referring to FIG. 3, in operation 430, an interface dielectric layer 130 is formed over the HZO layer 120 under a second temperature greater than the first temperature, wherein the HZO layer 120 is treated during the interface dielectric layer 130 is formed to generate the HZO layer 121. The HZO layer 121 is with mixture of the hafnium oxide layers and the zirconium oxide layers.

Referring to FIG. 4, in operation 440, a second electrode 140 over the interface dielectric layer 130.

Referring to FIG. 5, in operation 450, the HZO layer 121 and the interface dielectric layer 130 are anneal, so that the HZO layer 121 is crystalized to form a HZO layer 122 with great concentration of tetragonal crystal phase.

In another embodiment of the present disclosure, please refer to FIGS. 6-10B, 11 and FIG. 12.

Referring to FIGS. 6 and 11, in operation 410, a first electrode 210 is formed on a substrate 310.

Referring to FIG. 7, in operation 420, HZO layers 220 is formed over the first electrode 210 under a first temperature.

Referring to FIG. 8, in operation 430, interface dielectric layers 230 are formed over the HZO layer 220 under a second temperature greater than the first temperature, wherein the HZO layers 220 are treated during the interface dielectric layers 230 are formed to generate the HZO layer 221.

Referring to FIG. 9, in operation 440, second electrodes 240 over the interface dielectric layers 230.

Referring to FIGS. 10A and 10B, in operation 450, the HZO layers 221 and the interface dielectric layers 230 are anneal, so that the HZO layers 221 are crystalized to form HZO layers 222 with great concentration of tetragonal crystal phase.

In summary, the capacitor structure of the present disclosure can include a dielectric structure with at least two layers used as dielectric layers. Before the HZO layer of the at least two layers is annealed, materials of the HZO layer are mixed when a further interface dielectric layer is formed over the HZO layer, so that a concentration of a tetragonal crystal phase of the HZO layer can be introduced and the dielectric performance of the capacitor structure can be further improved. When the capacitor structure is used for a memory cell, since the HZO layer and the interface dielectric layer of the capacitor structure can be formed by just adjusting temperature, the capacitor structure can have a sufficient size for a small transistor and a suitable capacitance for operations of the overall 1T1C memory cell.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A capacitor structure, comprising:
   a first electrode;
   a hafnium-zirconium oxide (HZO) layer formed over the first electrode;
   an interface dielectric layer formed over the HZO layer;
   a second electrode formed over the interface dielectric layer, wherein the HZO layer and the interface dielectric layer are located between the first electrode and the second electrode, a first concentration of tetragonal crystal phase of the HZO layer is greater than a second concentration of tetragonal crystal phase of the interface dielectric layer; and
   a germanium structure in contact with the second electrode.

2. The capacitor structure of claim 1, wherein a material of interface dielectric layer is the same as a material of the HZO layer.

3. The capacitor structure of claim 1, wherein a thickness of the HZO layer is in a range between 4 nm and 6 nm.

4. A dynamic random access memory structure, comprising:
   a substrate;
   a transistor formed within the substrate, wherein a conductive pad of the transistor is formed over a top surface of the substrate; and
   the capacitor structure of claim 1, wherein the capacitor structure is formed over the substrate and connected to the conductive pad.

* * * * *